United States Patent
Spix et al.

(10) Patent No.: US 7,095,674 B2
(45) Date of Patent: Aug. 22, 2006

(54) MODULAR REGISTER ARRAY

(75) Inventors: Andy Spix, Redwood City, CA (US); Adrian Kaehler, Boulder Creek, CA (US); Sunil Sankar, San Jose, CA (US); Mike Reitsma, Burlingame, CA (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 10/677,080

(22) Filed: Sep. 30, 2003

(65) Prior Publication Data

US 2005/0071567 A1    Mar. 31, 2005

(51) Int. Cl.
  *G06F 12/00* (2006.01)
  *G11C 8/00* (2006.01)
  *G11C 15/00* (2006.01)
(52) U.S. Cl. .................... 365/230.05; 365/49; 711/131
(58) Field of Classification Search ........... 365/230.05, 365/49; 711/131
  See application file for complete search history.

(56) References Cited

U.S. PATENT DOCUMENTS

| 6,137,707 A * | 10/2000 | Srinivasan et al. ........... 365/49 |
| 6,163,473 A * | 12/2000 | Hannum ...................... 365/49 |
| 6,430,072 B1 * | 8/2002 | Chadwick et al. ............ 365/49 |
| 2005/0005069 A1 * | 1/2005 | Au et al. ..................... 711/131 |

* cited by examiner

*Primary Examiner*—Amir Zarabian
*Assistant Examiner*—Anthan Tran
(74) *Attorney, Agent, or Firm*—Schwegman, Lundberg, Woessner & Kluth, P.A.

(57) ABSTRACT

An integrated circuit includes a register array having a number of entry groups. Each of the entry groups includes multiple entries. Each of the entries has multiple bits. The bits among different entries are grouped into bit groups. The integrated circuit also includes a number of output ports. Each of the output ports has multiple selecting units. Each of the selecting units connects to one of the bit groups. The integrated circuit further includes a number of match ports. Each of the match ports has multiple comparing units. Each of the comparing units connects to one of the bit groups.

27 Claims, 10 Drawing Sheets

| $b_i$ | $REF_i$ | NODE 701 | $M_i$ |
|---|---|---|---|
| 0 | 0 | 0 | 1 |
| 0 | 1 | 1 | 0 |
| 1 | 0 | 1 | 0 |
| 1 | 1 | 0 | 1 |

FIG. 8

MODULAR REGISTER ARRAY

FIELD

Embodiments of the present invention relate generally to integrated circuits, and more particularly to register arrays.

BACKGROUND

Integrated circuits such as microprocessors reside in many computers and electronic devices. Some integrated circuits store data in a register array.

A typical register array includes many cells to store data. Input and output ports write and read data to and from the cells.

As integrated circuits handle more data, the register array may need more cells, input and output ports, or other components. However, adding more cells or other components to a conventional register array may cause signal interference and wiring difficulty.

BRIEF DESCRIPTION OF DRAWINGS

FIG. 8 shows a truth table for the function of the comparator of FIG. 7.

DESCRIPTION OF EMBODIMENTS

Figure 1:
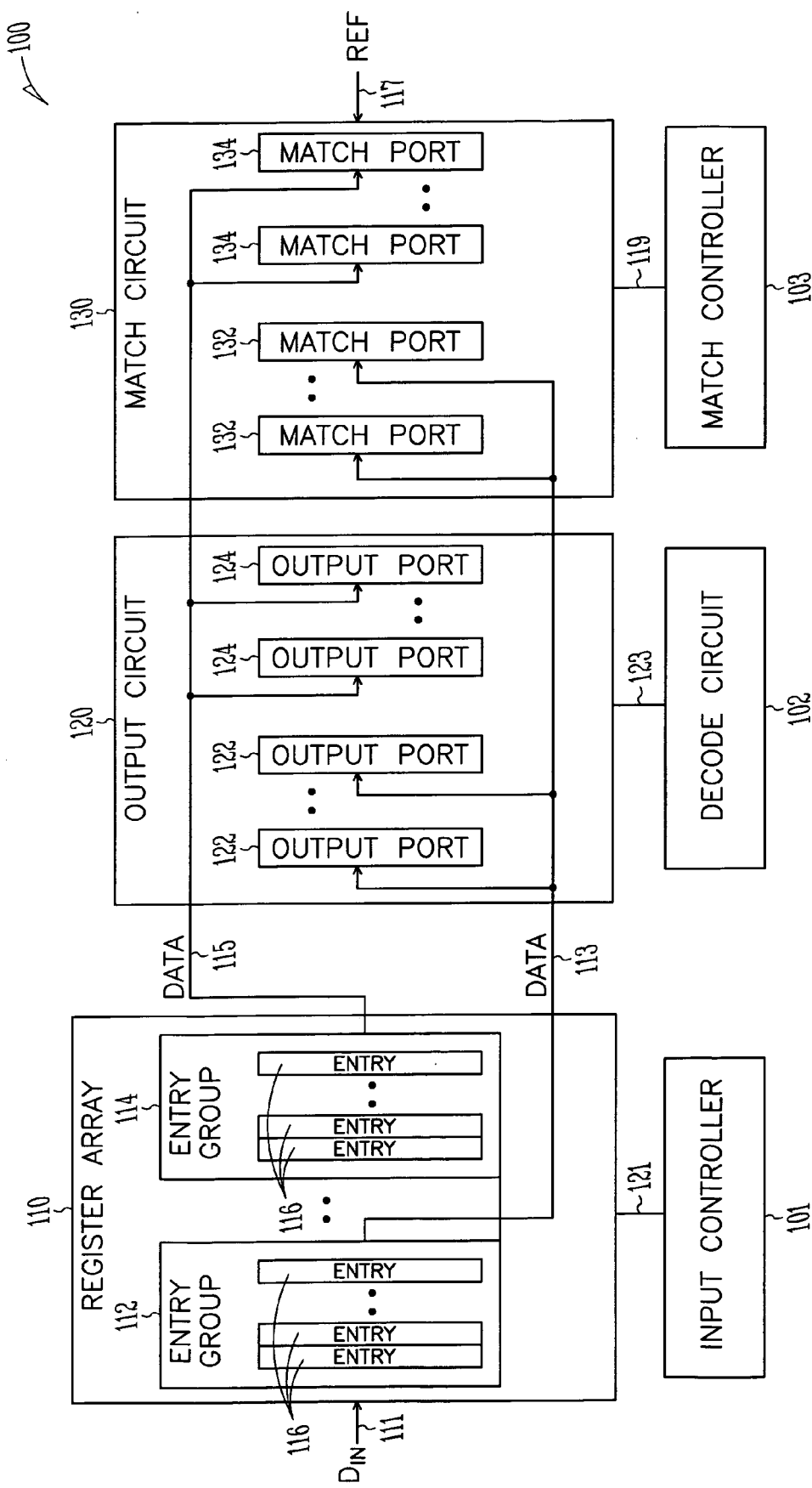
FIG. 1 shows an integrated circuit.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows an integrated circuit. Integrated circuit 100 includes a register array 110 to store data, and an output circuit 120 to output or read data from register array 110. A match circuit 130 determines whether register array 110 contains data that matches reference data. An input controller 101 controls data inputted or written to register array 110. A decode circuit 102 controls data outputted by output circuit 120. A match controller 103 operates on data provided by match circuit 130.

$D_{IN}$ presents the data inputted to register array 110. DATA represents the data (bits) available for outputting from register array 110. REF represents reference data. Each of the $D_{IN}$, DATA, and REF has multiple bits carried by multiple lines. For simplicity, FIG. 1 shows the multiple lines as a single line. Thus, each of the lines 111, 113, 115, 117, 119, 121, 123 has multiple lines.

Register array 110 includes a number of entry groups 112 and 114. Each of the entry groups 112 and 114 has multiple entries 116. For simplicity, FIG. 1 shows only three entries in each of the entry groups. The number of entries 116 in each of the entry groups may be any. For example, the number of entries 116 in each of the entry groups may be 4, 8, 16, 32, 64, or 128. Each entry 116 stores data or bits that represent a word. Thus, each of the entry groups 112 and 116 stores multiple words.

Output circuit 120 includes a number of output ports 122 and 124. A group of output ports connects to a corresponding entry group. For example, output ports 122 connect to entry group 112; output ports 122 connect to entry group 114. Each output port outputs data from the entry group to which the output port is connected.

Match circuit 130 includes a number of match ports 132 and 134. A group of match ports connects to a corresponding entry group. For example, match ports 132 connect to entry group 112; match ports 134 connect to entry group 114. Each match port compares data from the corresponding entry group with reference data REF.

Since the structure of integrated circuit 100 includes elements grouped in modules such as entry groups 112 and 114, output ports 122 and 124, and match ports 132 and 134, the structure of the integrated circuit 100 allows flexibility in adding or eliminating elements or modules. Thus, integrated circuit 100 allows addition or elimination of any combination of entry groups, output ports, and match ports without complex redesigning the structure of integrated circuit 100. Further, since the elements of the integrated circuit 100 are grouped in modules, fewer signal lines may be needed to access the elements. Therefore, integrated circuit 100 also has improved signal interference avoidance and reduced circuit wiring.

Figure 2:
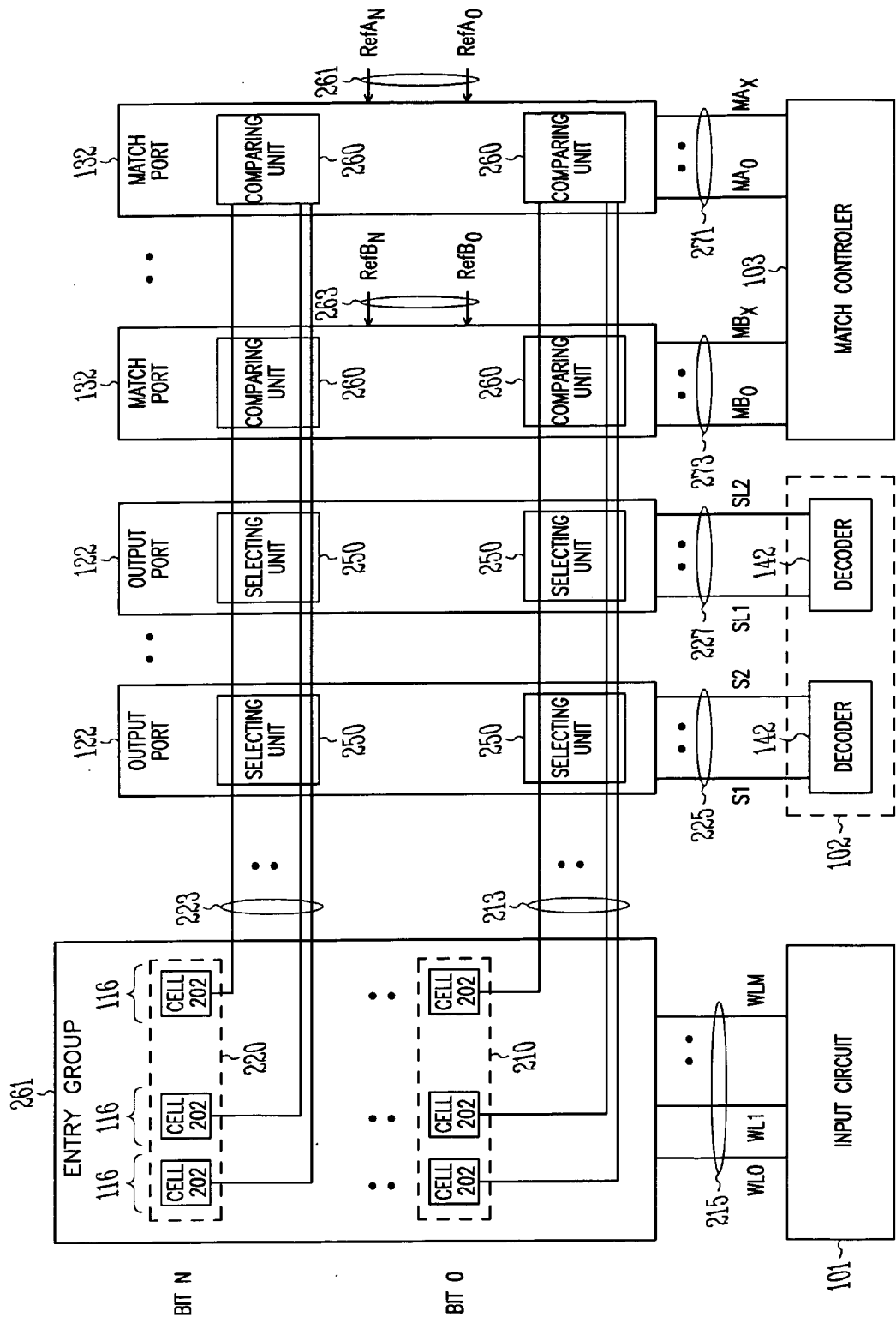
FIG. 2 shows a portion of the integrated circuit of FIG. 1.

FIG. 2 shows a portion of the integrated circuit of FIG. 1. In FIG. 2, each of the entries 116 includes a number of cells 202. For simplicity, FIG. 2 shows only two cells in each of the entries 116. The number of cells 202 in each of the entries 116 may be any number. For example, number of cells 202 in each of the entries 116 may be 4, 8, 16, 32, 64, or 128. In some embodiments, each cell 202 is a static memory cell. Each cell 202 stores a bit of data. Thus, each entry 116 stores multiple bits representing a word. Since the number of cells in each entry 116 may be 4, 8, 16, 32, 64, or 128, each entry 116 may store 4 bits, 8 bits, 16 bits, 32 bits, 64 bits, or 128 bits. Thus, the word stored in each entry 116 may have 4 bits, 8 bits, 16 bits, 32 bits, 64 bits, or 128 bits.

Entry group 112 connects to a number of word lines 215. Input controller 101 controls a number of word line signals WL0 through WLM to selectively write data into cells 202. Word lines 215 are represented in FIG. 1 as line 121. For simplicity, FIG. 2 shows only three word lines connected to entry group 112. In some embodiments, the number word lines 215 connected to entry group 112 is equal to the number of entries 116 in entry group 112. For example, if the number of entries 116 is equal to 16, the number of word lines 215 is also equal to 16.

Cells 202 are grouped into bit groups 210 and 220. FIG. 2 shows only two bit groups for simplicity. The number of bit groups is equal to the number of cells in each of the entries. For example, the number of bit groups 210 and 220 may be 4, 8, 16, 32, 64, or 128. Each of the bit groups includes one cell in the same cell position from each of the entries 116. For example, bit group 210 includes one cell at position labeled BIT 0 from each of the entries 116; bit group 220 includes one cell in position labeled BIT N from each of the entries 116. Thus, each of the bit groups 210 and 220 includes multiple bits from multiple entries in which the multiple bits are from the same bit position among the multiple entries.

In some embodiments, in each entry 116, the cell at BIT 0 position stores a bit that represents the least significant bit or least significant digit of a word; and the cell at BIT N position stores a bit that represents the most significant bit or the most significant digit of the word.

Bit group 210 connects to a group of output lines 213. Bit group 220 connects to a group of output lines 223. Output lines 213 and 223 are shown together in FIG. 1 as line 113 or line 115. Since each group of output lines 213 or 223 connects to the cells 202 at the same cell position, each of the lines 213 and lines 223 carry the bits representing the same significant digits among the entries 116. Thus, lines 213 carry the bits representing the significant digits at the same bit position BIT 0 among the entries 116; and lines 223 carry the bits representing the significant digits at the same bit position BIT N among the entries 116.

Lines 213 and lines 223 extend from entry group 112 to all output ports 122 and all match ports 132 to indicate that all output ports 122 and all match ports 132 receive the same data from lines 213 and lines 223.

Each output port 122 includes a number of selecting units 250. For simplicity, FIG. 2 shows only two selecting units in each of the output ports. The number of selecting units 250 in each of the output ports 122 is equal to the number of bit groups 210 and 220. For example, number of selecting units 250 in each of the output ports may be 4, 8, 16, 32, 64, or 128.

Each selecting unit 250 selects one of the bits from one of the bit groups. For example, the selecting unit connected to lines 213 selects one of the bits from bit group 210; the selecting unit connected to lines 223 selects one of the bits from bit group 220. The bits selected by all selecting units 250 within one output port 122 represent the bits of one of the entries 116. The bits selected by each output port 122 are used by other components of the integrated circuits for further processing.

Decode circuit 102 includes decoders 142. Each of the decoders 142 connects to one corresponding output port 122. Each the decoder provides separate select signals (or decode signals) to the corresponding output port. For example, select signals S1 through S2 on lines 225 are provided to one of the output ports by one of the decoders; select signals SL1 through SL2 on lines 227 are provided to another output port by another decoder. Lines 225 and 227 are represented together in FIG. 1 as line 123.

Each of the output ports 122 uses the corresponding select signals provided by the corresponding decoder to select the bits of bit groups 210 and 220. Thus, each output port 122 may select a different combination of bits from bit groups 210 and 220.

Each of the match ports 132 includes a number of comparing units 260. For simplicity, FIG. 2 shows only two comparing units in each of the match ports. The number of comparing units in each of the match ports 132 is equal to the number of bit groups 210 and 220. For example, number of comparing units 260 in each of the match ports may be 4, 8, 16, 32, 64, or 128.

Match ports 132 provide the results of the comparisons on a first group of match signals, $MA_0$ through $MA_X$, on match lines 271 and on a second group of match signals, $MB_0$ through $MB_X$, on match lines 273. Match controller 103 uses $MA_0$–$MA_X$ and $MB_0$–$MB_X$ $MA_0$ for further processing such as initiating a read operation to output data from entry group 112.

Lines 271 and lines 273 are represented together in FIG. 1 as line 119. For simplicity, FIG. 2 shows only two match lines 271 and two match lines 273. The number of lines 271 is equal to the number of entries 116 in entry group 112. The number of lines 273 is also equal to the number of entries 116 in entry group 112. For example, if the number of entries 116 is equal to 16, the number of lines 271 is equal to 16 and the number of lines 273 is also equal to 16.

Each of the match ports 132 connects to a group of reference lines, for example, group of lines 261 or group of lines 263. Lines 261 receive reference data or signals or bits $RefA_0$ through $RefA_N$. Lines 263 receive reference data or signals or bits $RefB_0$ through $RefB_N$. Lines 261 and 263 are represented together in FIG. 1 as line 117. For simplicity, FIG. 2 shows only two reference lines connected to each of the match ports 132. The number of reference lines 261 is equal to the number of bit groups 210 and 220. The number of reference lines 263 is also equal to the number of bit groups 210 and 220. For example, the number of lines 261 may be 4, 8, 16, 32, 64, or 128.

In some embodiments, the combination of $RefA_0$–$RefA_N$ and the combination of $RefB_0$–$RefB_N$ represent the same data (same word). In other embodiments, the combination of $RefA_0$–$RefA_N$ and the combination of $RefB_0$–$RefB_N$ represent different data (different words).

The match port 132 connected to reference lines 261 activates one or more of the match signals $MA_0$–$MA_X$ when the combination of bits of one or more of the entries 116 matches the combination of reference bits $RefA_0$–$RefA_N$.

The match port 132 connected to reference lines 263 activates one or more of the match signals $MB_0$–$MB_X$ when the combination of bits of one or more of the entries 116 matches the combination of reference bits $RefB_0$–$RefB_N$.

When $RefA_0$–$RefA_N$ and $RefB_0$–$RefB_N$ represent the same data, all of the match ports 132 activate an equal number of match signals to indicate the results of the comparison. For example, when $RefA_0$–$RefA_N$ and $RefB_0$–$RefB_N$ are the same, after the comparisons, $MA_0$ and $MB_0$ are activated, or $MA_X$ and $MB_X$ are activated, or all of $MA_0$–$MA_X$ and all of $MB_0$–$MB_X$ are activated.

Figure 3:
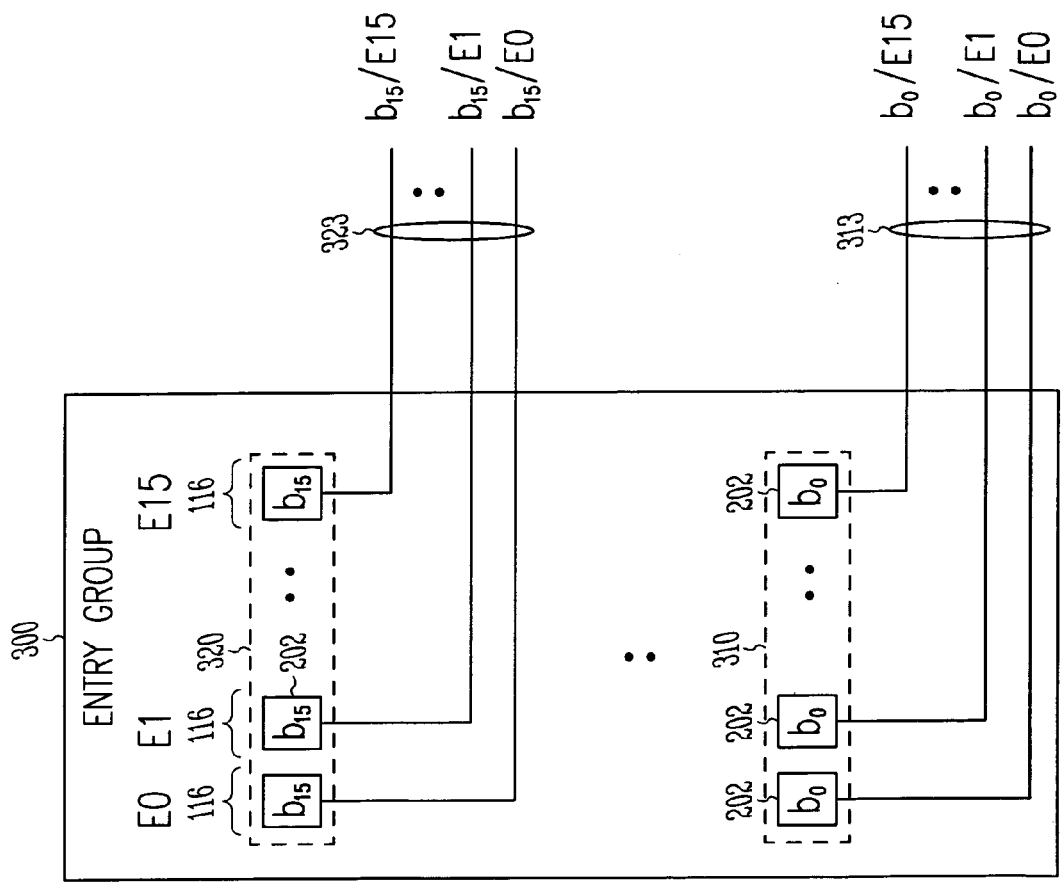
FIG. 3 shows an entry group with exemplary numbers of entries and bits.

FIG. 3 shows an entry group with exemplary numbers of entries and bits. Entry group 300 is similar to entry group 112 of FIG. 2. In FIG. 3, entry group 300 has an exemplary number of 16 entry indicated by E0, E1, through E15. Each of the entries E0–E15 has an exemplary number of 16 bits indicated by $b_0$, $b_1$, through $b_{15}$. Thus, each of the entries E0–E15 has sixteen cells 202 to store sixteen bits $b_0$–$b_{15}$. Bits $b_0$–$b_{15}$ of all of the entries E0–E15 are grouped into bit groups such as bit groups 310 and 320.

A number of groups of output lines 313 and 323 connect to the bit groups. Lines 313 connect bit group 310 to provide bits $b_0$ of the entries E0–E15. Lines 323 connect bit group 320 to provide bits $b_{15}$ of the entries E0–E15. Label $b_0$/E0 indicates bit $b_0$ of entry E0; label $b_0$/E1 indicates bit $b_0$ of entry E1. Other bits follow a similar designation. Lines 313 and lines 323 are similar to lines 213 and lines 232 of FIG. 2. Thus, lines 313 and 323 of FIG. 3 may connect to all output ports and all match ports such as output ports 122 and match port 132 of FIG. 2.

Figure 4:
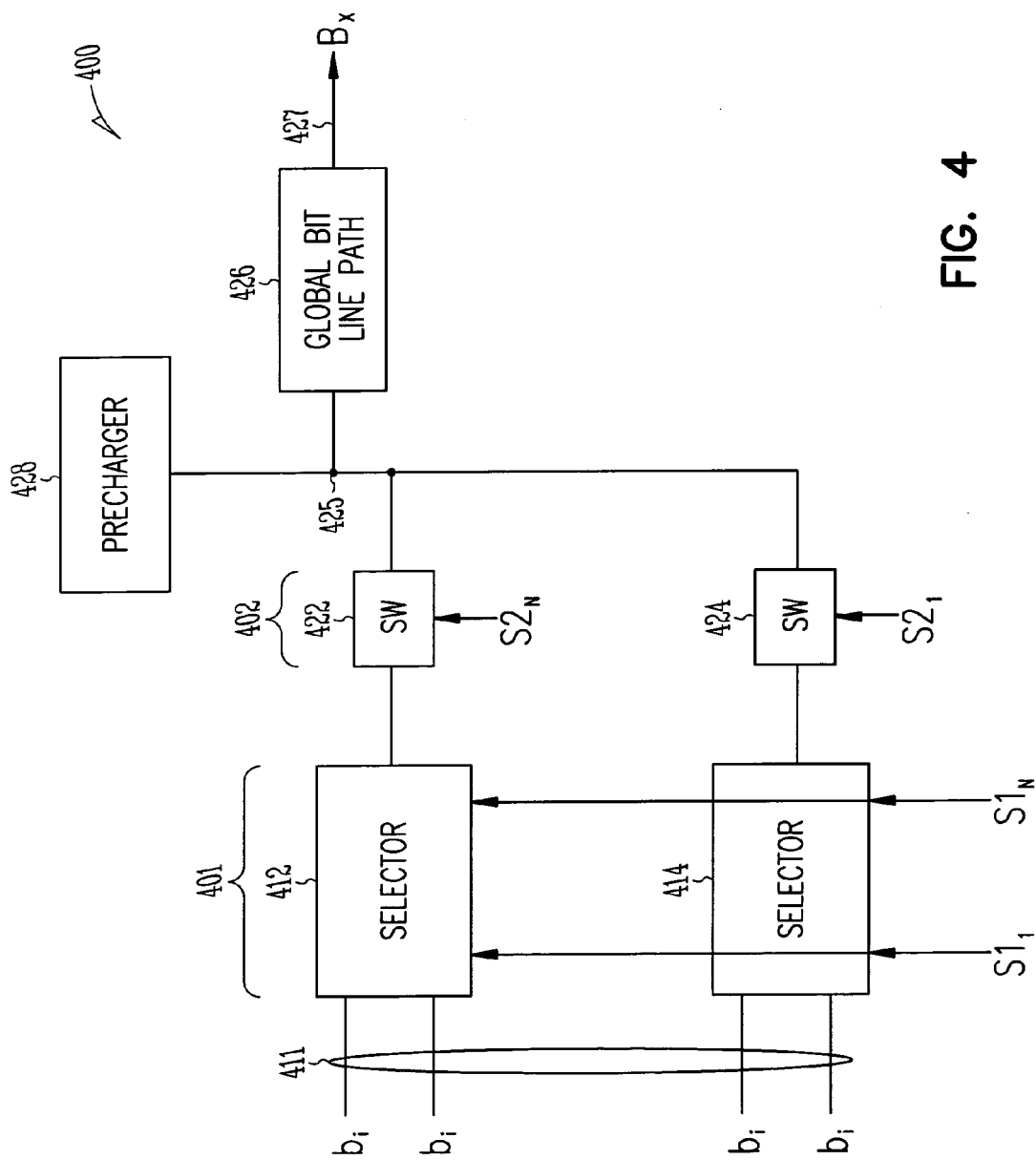
FIG. 4 shows a block diagram of a selecting unit.

FIG. 4 shows a block diagram of a selecting unit. Selecting unit 400 represents one of the selecting units 250 of FIG. 2. In FIG. 4, selecting unit 400 includes a first multiplexing (MUX) portion 401 and a second multiplexing (MUX) portion 402. MUX portion 401 includes a number of selectors 412 and 414. MUX portion 402 includes a number of switches (SW) 422 and 424. A number of lines 411 provide a number of bits $b_i$. Lines 411 are similar to lines 213 or lines 223 (FIG. 2) or similar to lines 313 or lines 323 (FIG. 3). Bits $b_i$ represent the bits of a bit group such as bits $b_0$ of bit group 310 or bits $b_{15}$ of bit group 320 (FIG. 3). A number of select signals $S1_1$ through $S1_N$ controls both selectors 412 and 414 of MUX portion 401. A number of other select signals $S2_1$ through $S2_N$ controls switches 422 and 424 of MUX portion 402. $S1_1$–$S1_1N$ and $S2_1$–$S2_N$ are shown in FIG. 2 as S1–S2 or SL1–SL2.

In FIG. 4, selectors 412 and 414 select a subset of $b_i$ bits from among all of the $b_i$ bits on lines 411 based on select signals $S1_1$–$S1_N$. Switches 422 and 424 connects one of the selectors 412 and 414 to a precharge node 425 based on the select signals $S2_1$–$S2_N$. Connecting one of the selectors 422 and 424 to node 425 allows one $b_i$ bit from the selected subset of $b_i$ bits to be transferred to node 425. A global bit line path 426 passes the selected $b_i$ bit to a global bit line 427 as $B_X$. Thus, $B_X$ is one of the $b_i$ bits on lines 411.

A precharger 428 charges node 425 to an initial value before the selected $b_i$ bit is transferred to node 425. Thus, node 425 is precharged. In some embodiments, node 425 is precharged to a high voltage such as a supply voltage (Vcc) of the integrated circuit. In other embodiments, node 425 is precharged to a low voltage such as a zero voltage or ground.

Figure 5:
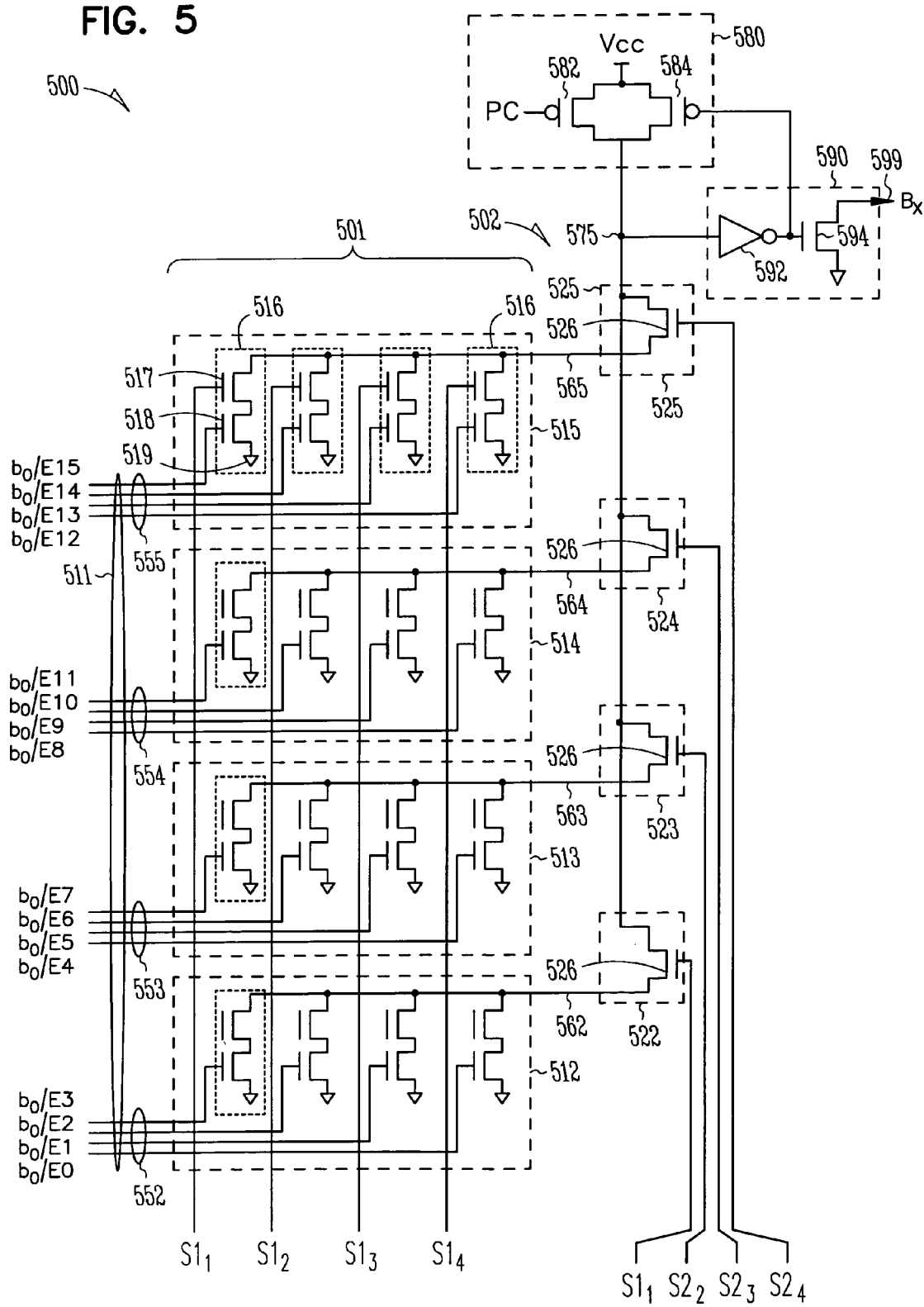
FIG. 5 shows a circuit diagram of a selecting unit.

FIG. 5 shows a circuit diagram of a selecting unit. Selecting unit 500 represents selecting unit 400 of FIG. 4 and one of the selecting units 250 of FIG. 2. In FIG. 5, selecting unit 500 includes a first MUX portion 501 and a second MUX portion 502. MUX portion 501 includes a number of local bit lines 562, 563, 564, and 565, and a number of selectors 512, 513, 514 and 515. Each of the selectors 512–515 includes a number of first switches 516 connected to one of the local bit lines 562–565. Each of the first switches 516 includes a pair of transistors 517 and 518 connected in series between one of the local bit lines and a supple node 519. The number of first switches 516 is equal to the number of entries in each entry group such as entry group 112 (FIG. 2) or in entry group 30 (FIG. 3). In FIG. 5, selecting unit 500 includes 16 first switches 516 as an example. In other embodiments, the number of first switches 516 may be any.

MUX portion 502 includes a number of second switches 522, 523, 524, and 525. Each of the second switches 522–525 includes a transistor 526 connected between one of the local bit lines 562–565 and a precharge node 575.

A number of lines 511 provides a number of bits to selecting unit 500. Bits $b_0$/E0, $b_0$/E1 through $b_0$/E15 on lines 511 represent the bits from a bit group such as bit group 310 of FIG. 3. As an example, the bits on lines 511 of FIG. 5 are bits $b_0$. The bits on lines 511 may be other bits from another bit group such as bits $b_{15}$ from bit group 320 of FIG. 3.

Lines 511 have a number of subsets of lines 552, 553, 554, and 555. Each of the selectors 512–515 connects to a corresponding subset of lines. For example, selector 512 connects to subset of lines 552. Each subset of lines carries a corresponding subset of bits. For example, subset of lines 552 carries bits $b_0$ from entries E0, E1, E2, and E3. As another example, subset of lines 555 carries bits $b_0$ from entries E12, E13, E14, and E15.

Each of the selectors 512–515 selects one bit within the corresponding subset of bits based on one of the first select signals $S1_1$, $S1_2$, $S1_3$, and $S1_4$. The selected bit is passed to one of the local bit lines 562–565. Based on the second select signals $S2_1$, $S2_2$, $S2_3$, and $S2_4$, one of the second switches 522–525 connects the local bit line having the selected bit to node 575. Consequently, the selected bit is transferred from the local bit line to node 575. Thus, a combination of one of the $S1_1$, $S1_2$, $S1_3$, and $S1_4$ and one of the $S2_1$, $S2_2$, $S2_3$, and $S2_4$ selects one bit from lines 511 and transfers the selected bit to node 575. For example, the combination of the $S1_1$ and $S2_1$ signals selects bit $b_0$/E3 and transfers it to node 575. As another example, the combination of the $S_1$ and $S2_2$ signals selects bit $b_0$/E7 transfers it to node 575. A decoder such as decoder 142 (FIG. 2) determines the combination of the $S1_1$, $S1_2$, $S1_3$, and $S1_4$ signals and the $S2_1$, $S2_2$, $S2_3$, and $S2_4$ signals to select the bits on lines 511 and to transfer the selected bit to node 575.

Selecting unit 500 also includes a precharger 580 having transistors 582 and 584. The gate of transistor 582 is controlled by a precharge signal PC. In some embodiments, precharger 580 charges (or precharges) node 575 to an initial value. In some embodiments, the initial value is a high voltage such as the supply voltage (Vcc) of the integrated circuit. In other embodiments, the initial value is a low voltage such as zero voltage or ground. As an example, node 575 may be precharged to Vcc by providing the PC signal with a low signal level.

Selecting unit 500 further includes a global bit line path 590 including an inverter 592 and a transistor 594. After the selected bit from lines 511 is passed to node 575, path 590 passes the selected bit from node 575 to a global bit line 599. $B_X$ at global bit line 599 represents one of the $b_0$ bits selected from lines 511.

Figure 6:
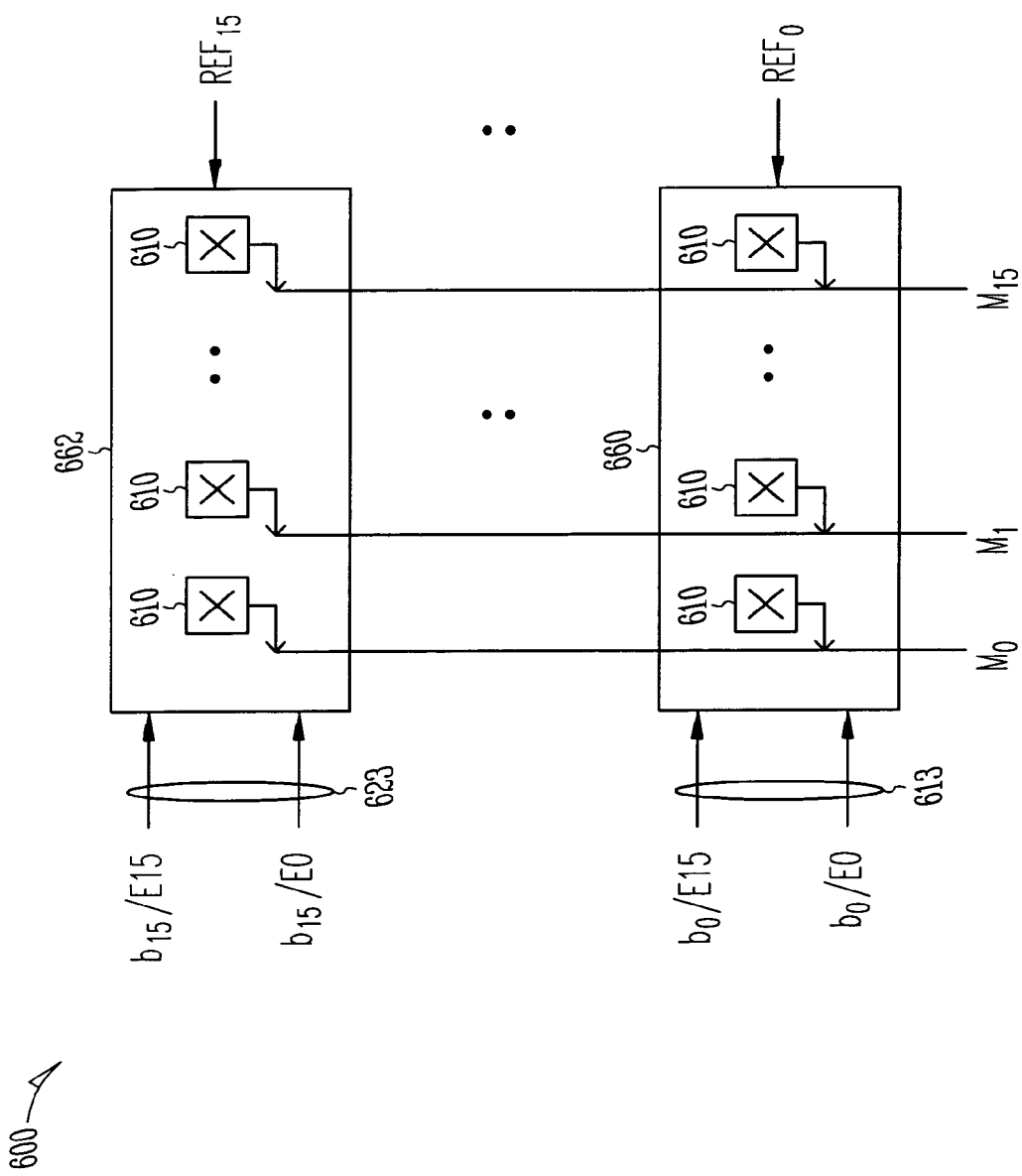
FIG. 6 shows a block diagram of match port having comparators.

FIG. 6 shows a block diagram of a match port. Match port 600 represents one of the match ports 132 of FIG. 2. In FIG. 6, match port 600 includes a number of comparing units 660 and 662. Comparing units 660 and 662 represent comparing units 260 of FIG. 2. In FIG. 6, comparing unit 660 compares each of the bits $b_0$/E0, $b_0$/E1 through $b_0$/E15 on lines 613 with a reference bit $Ref_0$. Comparing unit 662 compares each of the bits $b_{15}$/E0, $b_{15}$/E1 through $b_{15}$/E15 on lines 623 with a reference bit $Ref_{15}$. Each of the comparing units 660 and 662 includes a number of comparators (indicated by X) 610. Each comparator 610 compares one bit of a group of bits with a reference bit. For example, each comparator 610 of comparing unit 660 compares one of the bits $b_0$/E1 through $b_0$/E15 with bit $Ref_0$. Each comparator 610 of comparing unit 662 compares one of the $b_{15}$/E1 through $b_{15}$/E15 with bit $Ref_{15}$.

In some embodiments, comparators 610 of comparing unit 660 simultaneously compare bits $b_0$/E1 through $b_0$/E15 with bit $Ref_0$; comparators 610 of comparing unit 662 simultaneously compare bits $b_{15}$/E1 through $b_{15}$/E15 with bit $Ref_{15}$. In other embodiments, comparing units 660 and 662 perform all of the comparisons simultaneously with each other.

Lines 613 and 623 are similar to lines 213 and 223 of FIG. 2 or similar to lines 313 and 323 of FIG. 3. In FIG. 6, bits $b_0$ are provided by one bit group such as bit group 310. Bits $b_{15}$ are provided by another bit group such as bit group 320 (FIG. 3). In FIG. 6, the number of bits provided to each of the comparing units 660 and 662 is equal to 16 ($b_0$–$b_{15}$). In some embodiments, the number of bits provided to each of the comparing units 660 and 662 may be any.

A number of match signals $M_0$–$M_{15}$ indicates the results of the comparisons by comparing units 660 and 662. Each of the match signals $M_0$–$M_{15}$ indicates the results of the comparisons between the bits of one entry with the reference bits $Rref_0$–$Ref_{15}$. Match signal $M_0$ indicates the results of the comparisons between the bits of entry E0 with bits $Rref_0$–$Ref_{15}$. Match signal $M_{15}$ indicates the results of the comparisons of the bits of entry E15 with $Rref_0$–$Ref_{15}$.

Within comparing unit 660, the comparator 610 connected to $M_0$ compares bit $b_0$ of entry E0 with $Ref_0$ and gives the result to $M_0$. Within comparing unit 662, the comparator connected to $M_0$ compares bit $b_{15}$ of entry E0 with $Ref_{15}$ and also gives the result to $M_0$. If all of the bits of an entry match the reference bits ($b_0$/E0 matches $Ref_0$ and $b_{15}$/E0 matches $Ref_{15}$), then $M_0$ indicates a match. If any one of the comparison results in a mismatch, e.g., $b_0$/E0 and $Ref_0$ are not matched, $M_0$ indicates a mismatch.

Each of the $M_0$–$M_{15}$ has a first signal level and a second signal level. In some embodiments, the first signal level may indicate a match between the bits of an entry with $Rref_0$–$Ref_{15}$; a second signal level may indicates a mismatch between the bits of an entry with $Rref_0$–$Ref_{15}$. As an example, In FIG. 6, if the bits of only entry E0 matches $Rref_0$–$Ref_{15}$, $M_0$ will have one signal level (e.g., high) and all of the other matches signals $M_1$–$M_{15}$ will have another signal level (e.g., low). A match controller such as match controller 103 of FIG. 1 and FIG. 2 uses $M_0$–$M_{15}$ for other functions such as initiating a read operation to output data from an entry group, e.g., entry group 112 and 300 (FIG. 1–FIG. 3).

Figure 7:
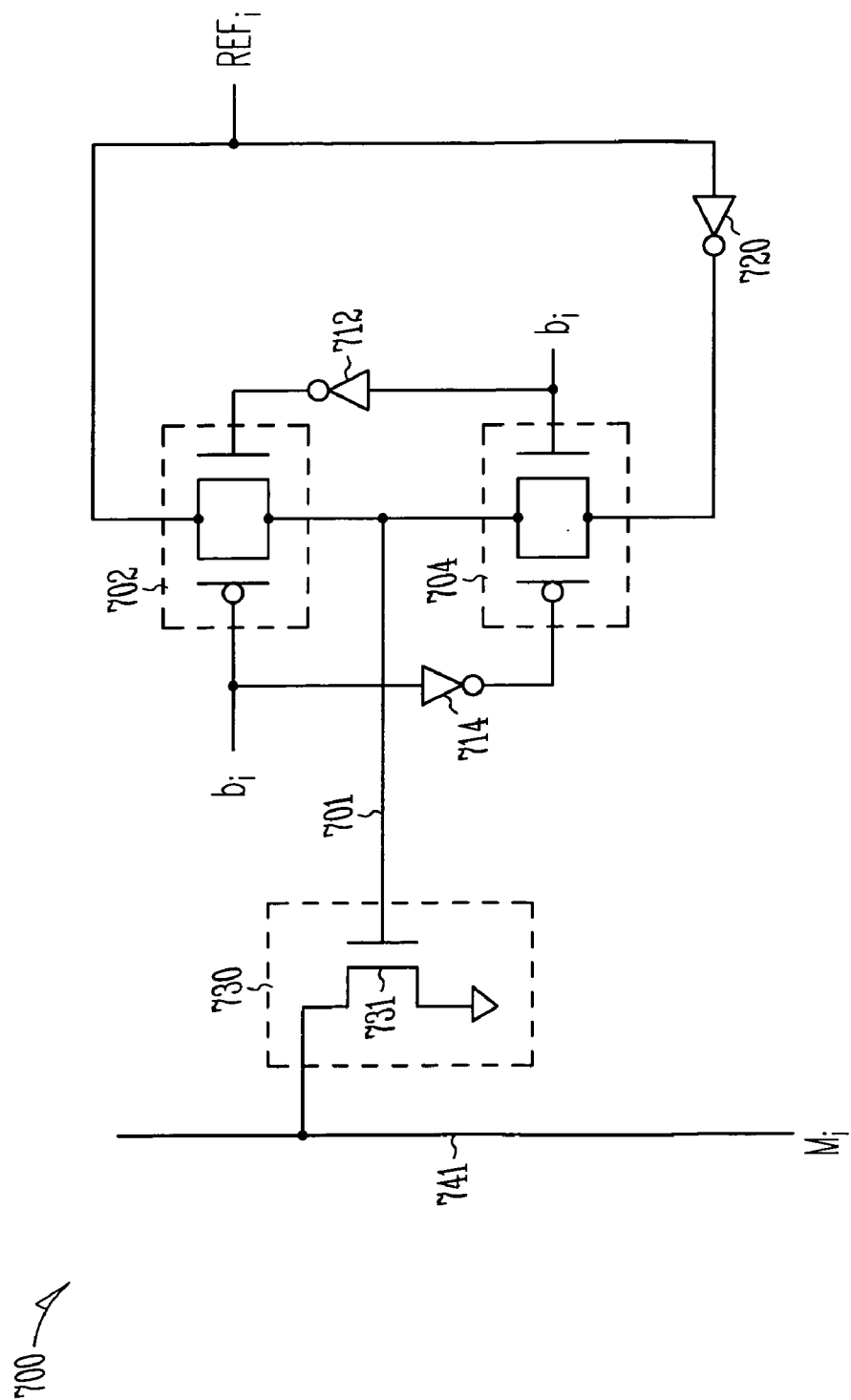
FIG. 7 shows a circuit diagram of a comparator.

FIG. 7 shows a circuit diagram of a comparator. Comparator 700 represents comparator 610 of FIG. 6. In FIG. 7, comparator 700 includes pass gates 702 and 704 and inverters 712 and 714. Pass gates 702 and 704 and inverters 712 and 714 form a logic unit to perform an exclusive OR function on inputs $b_i$ and $Ref_i$. Node 701 provides the result of the exclusive OR function. An inverter 720 provides an inverse of $Ref_i$. A pull down device 730 includes a transistor 731 connected between node 701 and a match line 741. Pull down device 730 affects a signal level of a match signal $M_i$ on line 741. Line 741 is initially charged (precharged) to an initial value such as Vcc (high). Input $b_i$ represents one of the bits such as one of the $b_0$/E0 through $b_0$/E15 or one of the $b_{15}$/E0 through $b_{15}$/E15 (FIG. 6). Input $Ref_i$ represents one of the reference bits $Rref_0$–$Ref_{15}$ (FIG. 6). Match signal $M_i$ represents one of the match signals $M_0$–$M_{15}$ (FIG. 6).

Figure 8:
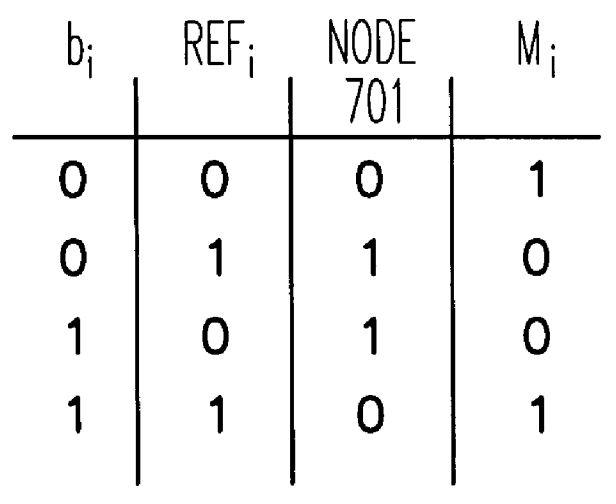

FIG. 8 is a true table for the function of comparator 700 of FIG. 7. In the table of FIG. 8, $M_i$ has a logic 1 (high) when $b_i$ and $Ref_i$ are matched or have the same logic value. For example, $M_i$ has a logic 1 when both of $b_i$ and $Ref_i$ have a logic 1. As another example, $M_i$ also has a logic 1 when both of $b_i$ and $Ref_i$ have a logic 0. $M_i$ has a logic 0 (low) when $b_i$ and $Ref_i$ are mismatched or have different logic values.

In FIG. 7, when $b_i$ and $Ref_i$ are matched, node 701 is has a low voltage, e.g. ground. Since the gate of transistor 731 connects to node 701 and node 701 is low in this case, transistor 731 is not activated or turns off. Thus, $M_i$ on line 741 remains high (the initial value) indicating a match between $b_i$ and $Ref_i$. When $b_i$ and $Ref_i$ are mismatched, node 701 has a high voltage, e.g. Vcc. The high voltage on node 701 activates or turns on transistor 731, forcing a low voltage, e.g. ground, to line 741. Thus, $M_i$ on line 741 becomes low, indicating a mismatch between $b_i$ and $Ref_i$.

Figure 9:
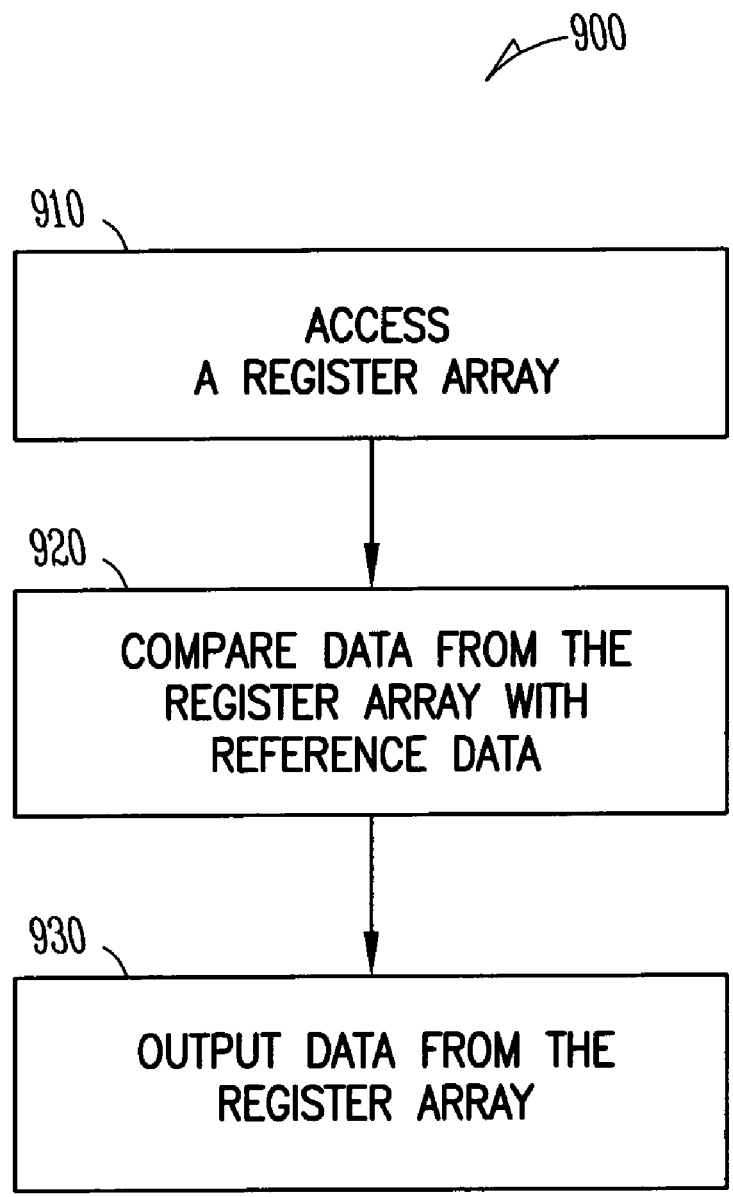
FIG. 9 shows a flowchart of a method of operating a register array.

FIG. 9 shows a flowchart of a method of operating a register array. Method 900 accesses data or bits in a register array. Method 900 also compares data in the register array with reference data. Method 900 further outputs the data from the register array. Method 900 includes operations performed in boxes 910, 920, and 930. The operations in boxes 910, 920, and 930 may be performed in any order. In some embodiments, one or more of the operations in boxes 910, 920, and 930 may be omitted.

Box 910 accesses the register array. The register array in box 910 may be the register array described in FIG. 1–3 in which the register array includes entry groups and bit groups.

Box 920 compares the data in the entries of an entry group with reference data. The comparison in box 920 may be performed by a match circuit having match ports such as match ports 132 and 134 described in FIG. 1, FIG. 2, and FIG. 6–FIG. 8.

Box 930 outputs or reads the data from at least one of the entries. The output or read operation in box 930 may be performed by an output circuit having output ports such as output ports 122 and 124 described in FIG. 1, FIG. 2, FIG. 4, and FIG. 5.

Figure 10:
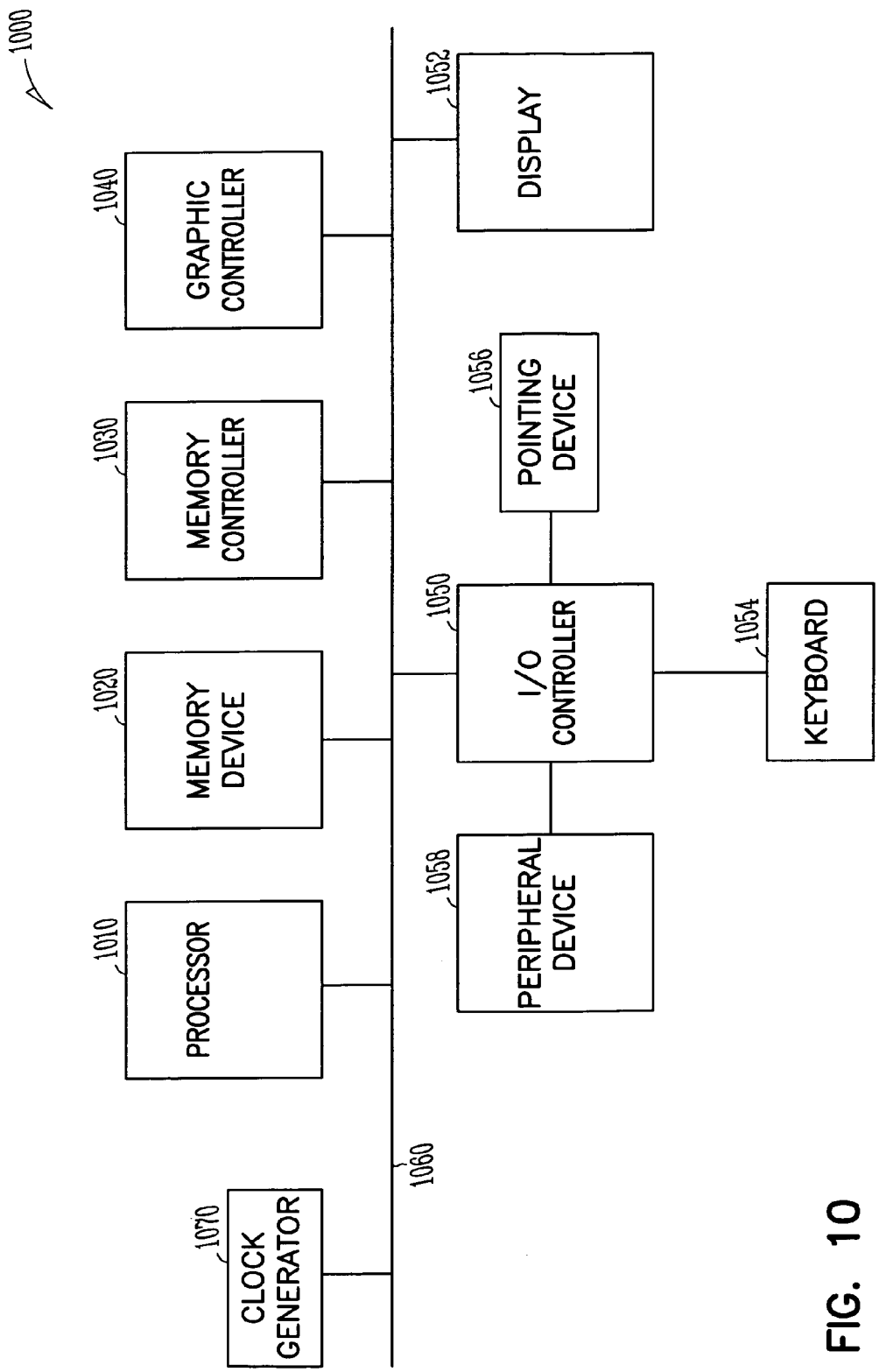
FIG. 10 shows a system.

FIG. 10 shows a system 1000. System 1000 includes a processor 1010, a memory device 1020, a memory controller 1030, a graphic controller 1040, an input and output (I/O) controller 1050, a display 1052, a keyboard 1054, a pointing device 1056, and a peripheral device 1058. A bus 1060 connects all of these devices together. A clock generator 1070 provides an external signal EXT_CLK to at least one of the devices of system 1010 via bus 1060. Example of clock generator 1070 includes an oscillator in a circuit board such as a motherboard. Two or more devices shown in system 1000 may be formed in a single chip.

At least one of the devices shown in system 1000 includes an integrated circuit such as integrated circuit 100 including all elements shown in FIG. 1 through FIG. 8.

Bus 1060 may be interconnect traces on a circuit board or may be one or more cables. Bus 1060 may also connects the devices of system 1000 by wireless means such as by electromagnetic radiation, for example, radio waves. Peripheral device 1058 may be a printer, an optical device such as CD-ROM and DVD reader and writer, a magnetic device reader and writer such as a floppy disk driver, or an audio device such as a microphone.

Memory device 1020 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), GDDR SDRAM (Graphic Double Data Rate). Memory device 1020 may also be a static random access memory (SRAM) device, or may be a flash memory device.

System 1000 represented by FIG. 10 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

What is claimed is:

1. A circuit comprising:
   a plurality of entries, each of the entries having a number of cells including at least a first cell and a second cell;
   an output port having a number of selecting units including at least a first selecting unit coupled to the first cell of each of the entries and a second selecting unit coupled to the second cell of each of the entries; and
   a match port having a number of comparing units including at least a first comparing unit coupled to the first cell of each of the entries and a second comparing unit coupled to the second cell of each of the entries.

2. The circuit of claim 1, wherein the first selecting unit includes:
   a first multiplexing portion to select a selected first cell, the selected first cell being the first cell of one of the entries; and
   a second multiplexing portion coupled to the first multiplexing portion to transfer data from the selected first cell to a global bit line.

3. The circuit of claim 1, wherein the first comparing unit includes a number of comparators to compare data from the first cell of each of the entries with a reference data.

4. The circuit of claim 3, wherein each of the comparator includes a logic unit to perform a logic function on data from the first cell of each of the entries with the reference data.

5. The circuit of claim 1, wherein the number of the selecting units is equal to the number of comparing units.

6. An integrated circuit comprising:
   a plurality of entry groups, each of the entry groups including multiple entries, each of the entries including multiple cells, the cells being grouped into a number of bit groups, each of the bit groups including one cell from each of the entries;
   a plurality of output ports, each of the output ports including multiple selecting units; each of the selecting units including input nodes coupled to a corresponding bit group, the corresponding bit group being one of the bit groups; and
   a plurality of match ports, each of the match ports including multiple comparing units; each of the comparing units including input nodes coupled to the corresponding bit group.

7. The integrated circuit of claim 6, wherein each of the selecting units includes:
   a number of local bit lines;
   a number of selectors, each of the selectors including a plurality of first switches coupled to one of the local bit lines, each of the first switches coupling to one cell of the corresponding bit group; and
   a number of second switches, each of the second switches coupling between one of the local bit lines and a precharge node.

8. The integrated circuit of claim 7, wherein each of the comparing units includes a plurality of comparators, each of the comparators coupling to one cell of the corresponding bit group and to a reference node.

9. The integrated circuit of claim 8, wherein each of the comparators includes a pair of pass gates coupled to one cell of the corresponding bit group and to the reference node.

10. The integrated circuit of claim 7, wherein each of the selecting units further includes a precharger to charge the precharge node to an initial value.

11. The integrated circuit of claim 10, wherein each of the first switches includes a pair of transistors coupled in series between one of the local bit lines and a supply node.

12. The integrated circuit of claim 11, wherein a number of first switches equals a number of entries in each of the entry groups.

13. The integrated circuit of claim 6 further comprising an input controller having a plurality of word lines, each of the word lines coupling to one of the entries.

14. The integrated circuit of claim 13 further comprising a plurality of decoders, each of the decoders coupling to one of the output ports.

15. A system comprising:
   an integrated circuit including,
      a register array to store data, the register array including at least one entry group having multiple entries, each of the entries including multiple cells, the cells being grouped into a number of bit groups, each of the bit groups including one cell from each of the entries;
      at least one output port to output the data from the register array, the at least one output port having a number of selecting units; each of the selecting units coupling to one of the bit groups; and
      at least one match port to compare the data stored in the register array with reference data, the at least one match port having a number of comparing units, each of the comparing units coupling to one of the bit groups; and
   a dynamic random access memory device coupled to the integrated circuit.

16. The system of claim 15, wherein each of the selecting units includes:
   a first multiplexing portion to select a cell in one of the bit groups; and
   a second multiplexing portion coupled to the first multiplexing portion to transfer data from the cell to a global bit line.

17. The system of claim 16, wherein each of the comparing units includes a number of comparators to compare data from one of the bit groups with a reference data.

18. The system of claim 17 further comprising a decoder coupled to the at least one output port.

19. The system of claim 15, wherein the number of the selecting units is equal to the number of bit groups.

20. The system of claim 15, wherein the number of the comparing units is equal to the number of bit groups.

21. The system of claim 15, wherein the integrated circuit includes a processor.

22. A method comprising:
   accessing a group of entries, each of the entries having a number of bits including at least a first bit and a second bit, the first bit of each of the entries being grouped into a first bit group, the second bit of each of the entries being grouped into a second bit group;
   comparing the first bit of each of the entries with a first reference bit;
   comparing the second bit of each of the entries with a second reference bit; and
   activating at least one match signal if the first bit of a selected one of the entries matches the first reference bit and if the second bit of the selected one of the entries matches the second reference bit.

23. The method of claim 22, wherein accessing includes simultaneously accessing the first bit of each of the entries.

24. The method of claim 22 further comprising:
   reading bits in the first bit group to a first selector; and
   reading bits in the second bit group to a second selector.

25. The method of claim 24 further comprising:
   selectively transferring a bit from the first selector to a first global bit line; and
   selectively transferring a bit from the second selector to a second global bit line.

26. The method of claim 22, wherein comparing the first bit of each of the entries with the first reference bit occurs simultaneously.

27. The method of claim 26, wherein comparing the second bit of each of the entries with the second reference bit occurs simultaneously with the comparing the first bit of each of the entries with the first reference bit.

* * * * *